US012597949B2

(12) United States Patent
Tsai et al.

(10) Patent No.: US 12,597,949 B2
(45) Date of Patent: Apr. 7, 2026

(54) HAMMING CODE ENCODING AND ARRANGING METHOD AND STORAGE DEVICE DETECTION METHOD

(71) Applicant: FocalTech Systems Co., Ltd., Zhubei City (TW)

(72) Inventors: Yen-Kai Tsai, Zhubei City (TW); Shao-Cheng Wen, Zhubei City (TW)

(73) Assignee: FOCALTECH SYSTEMS CO., LTD., Zhubei City (TW)

( * ) Notice: Subject to any disclaimer, the term of this patent is extended or adjusted under 35 U.S.C. 154(b) by 0 days.

(21) Appl. No.: 18/807,215

(22) Filed: Aug. 16, 2024

(65) Prior Publication Data

US 2025/0167809 A1      May 22, 2025

(30) Foreign Application Priority Data

Nov. 20, 2023    (TW) ................................. 112144709

(51) Int. Cl.
*H03M 13/00*        (2006.01)
*H03M 13/11*        (2006.01)
(52) U.S. Cl.
CPC .............................. *H03M 13/1174* (2013.01)
(58) Field of Classification Search
CPC ...... H03M 13/13; H03M 13/09; H03M 13/11; H03M 13/00; H03M 13/1174
See application file for complete search history.

(56) References Cited

U.S. PATENT DOCUMENTS

| | | | | |
|---|---|---|---|---|
| 7,409,001 B2 * | 8/2008 | Ionescu | ................ | H04B 7/0417 |
| | | | | 375/267 |
| 8,352,840 B2 * | 1/2013 | Crozier | ............... | H03M 13/296 |
| | | | | 714/780 |
| 8,429,508 B2 * | 4/2013 | Kondo | ................. | H03M 13/19 |
| | | | | 714/763 |
| 9,455,745 B2 * | 9/2016 | Tantos | ................. | H03M 5/145 |
| 9,658,921 B2 * | 5/2017 | Kamali | .................. | G06F 11/10 |
| 9,692,456 B1 * | 6/2017 | Dabiri | ....................... | H04L 5/14 |
| 10,887,049 B2 * | 1/2021 | Smith | ................... | H04L 1/0059 |

* cited by examiner

*Primary Examiner* — Esaw T Abraham
(74) *Attorney, Agent, or Firm* — MUNCY, GEISSLER, OLDS & LOWE, P.C.

(57)        ABSTRACT

A Hamming code encoding and arranging method includes: dividing an original data into N groups of to-be-encoded data and performing Hamming code encoding on the N groups of to-be-encoded data to generate N groups of encoded data; for the N groups of encoded data, extracting p-bit encoded data in each group of encoded data for successive arrangement; when the number of bits remaining in each of the N groups of encoded data is greater than or equal to p, extracting p-bit encoded data in each group of encoded data for successive arrangement; and when there is no data remaining in each of the N groups of encoded data, generating rearranged encoded data according to the arrangement; or when there are q(<p) bits remaining in each group of encoded data, extracting q-bit encoded data in each group of encoded data for successive arrangement to generate rearranged encoded data.

11 Claims, 6 Drawing Sheets type-1, type-2, type-3 and type-4 Hamming code encoding and arranging methods are respectively defined corresponding to p=1, 2, 4 and 7 — S91 type = 1 — S92

S93 — self-test success — storage device is good and type is recorded — S96 fail

S94 — type >= 4

Yes — storage device is defective — S97

No type = type+1 — S95

HAMMING CODE ENCODING AND ARRANGING METHOD AND STORAGE DEVICE DETECTION METHOD

CROSS-REFERENCE TO RELATED APPLICATIONS

This application claims the benefits of the Taiwan Patent Application Serial Number 112144709, filed on Nov. 20, 2023, the subject matter of which is incorporated herein by reference.

BACKGROUND

Field of the Disclosure

The present disclosure relates to the technical field of error correction
during data transmission or access and, more particularly, to a Hamming code encoding and arranging method and storage device detection method.

Description of Related Art

In the field of error correction codes, the traditional Hamming code makes use of simple exclusive OR (XOR) operations for encoding and decoding the original data to achieve the effect of correcting a 1-bit error (i.e., one error bit) by inserting redundant bits. For example, the (7, 4) Hamming code is used to insert three redundant bits into 4-bit data so as to achieve the effect of correcting a 1-bit error. However, traditional Hamming code can only correct a 1-bit error, but cannot correct multi-bit errors (i.e., multiple error bits). If multi-bit error correction is desired, it is required to use other encoding algorithms, such as repetitive code, convolutional code, BCH code, RS code, etc. However, these encoding algorithms are more complicated or have higher implementation costs, and thus are not suitable for low-cost or low-power circuit design.

Therefore, in the application of traditional error correction codes, there are still many deficiencies to be alleviated and/or obviated.

SUMMARY

The object of the present disclosure is to provide a Hamming code encoding and arranging method and a storage device detection method, which can dynamically adjust the arrangement of multiple groups of Hamming code according to predictable error patterns so as to realize multi-bit error correction or detection with an optimal bit rate, and can be used to improve the yield of the storage device, while having the characteristics of low cost and simple architecture.

In one aspect, the present disclosure provides a Hamming code encoding and arranging method, which includes the steps of: (A) dividing an original data into N groups of to-be-encoded data and performing (c, a) Hamming code encoding on the N groups of to-be-encoded data, respectively, to generate corresponding N groups of codes thereby producing corresponding N groups of encoded data, wherein N is equal to Round(X/a), X represents a number of bits of the original data, a represents a number of bits of one group of to-be-encoded data, Round( ) represents an integer function, c represents a number of bits of one group of encoded data and c is equal to a+b, b represents a number of bits of one group of codes and is a minimum value satisfying $2^b >= a+b+1$, where X, N, a, b, c are each an integer greater than 0; (B) for the N groups of encoded data, extracting p-bit encoded data in each group of encoded data, and successively arranging N groups of extracted p-bit encoded data, where p is an integer greater than 0 and p is smaller than or equal to c; (C) when a number of bits of un-extracted encoded data remaining in each of the N groups of encoded data is greater than or equal to p, extracting p-bit encoded data in each group of the encoded data, and successively arranging N groups of extracted p-bit encoded data; and (D) when there is no un-extracted encoded data remaining in each of the N groups of encoded data, generating rearranged encoded data according to arrangement in step (B) and step (C); or when there is only q-bit un-extracted encoded data remaining in each of the N groups of encoded data, extracting q-bit encoded data in each of the N groups of encoded data, and successively arranging N groups of extracted q-bit encoded data so as to generate the rearranged encoded data, where q is an integer greater than 0 and smaller than p.

In another aspect, the present disclosure provides a storage device detection method for detecting a storage device using the aforementioned Hamming code encoding and arranging method, which includes: selecting multiple different values of p from a range of integer greater than 0 and smaller than or equal to c to define multiple types of Hamming code encoding and arranging methods according to the multiple different values of p, wherein the multiple types of Hamming code encoding and arranging methods correspond to the multiple different values of p, respectively; using the multiple types of Hamming code encoding and arranging methods in sequence to perform a self-test on the storage device, wherein, when the self-test for a type of Hamming code encoding and arranging method is successful, the Hamming code encoding and arranging method of the type is recorded in the storage device and the self-test is ended and, when the self-test for all types of Hamming code encoding and arranging methods fails, the storage device is determined to be defective.

Other novel features of the disclosure will become more apparent
from the following detailed description when taken in conjunction with the accompanying drawings.

DETAILED DESCRIPTION OF EMBODIMENT

The following embodiments describe the implementation and operation principles of the present disclosure. Those skilled in the art to which the present disclosure pertains may understand the features and effects of this disclosure through the aforementioned embodiments, and may perform combination, modification, replacement or adaption based on the spirit of the present disclosure.

Figure 1:
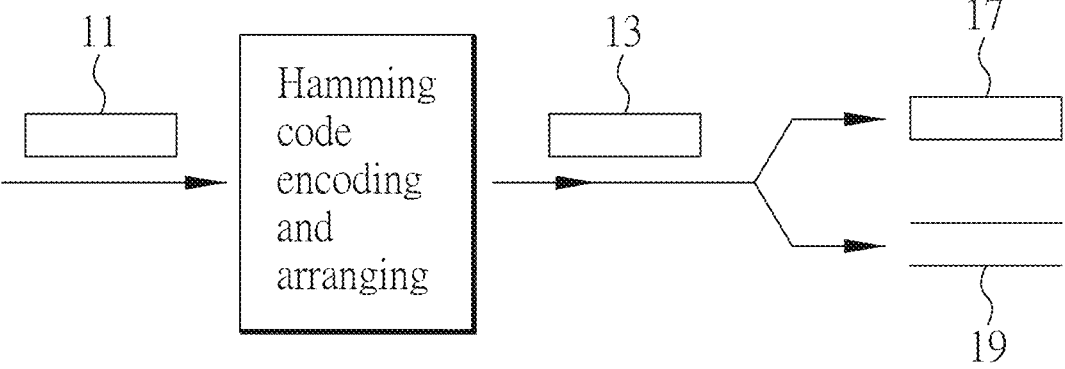
FIG. 1 schematically illustrates the application of the Hamming code encoding and arranging method of the present disclosure.

FIG. 1 schematically illustrates the application of the Hamming code encoding and arranging method of the present disclosure, wherein the Hamming code encoding and arranging method is used to perform Hamming code encoding on an original data 11 and perform rearrangement on the encoded data so as to generate rearranged encoded data 13, thereby transmitting out the rearranged encoded data 13 through the transmission channel 19 or storing the rearranged encoded data 13 in a storage device 17.

Figure 2:
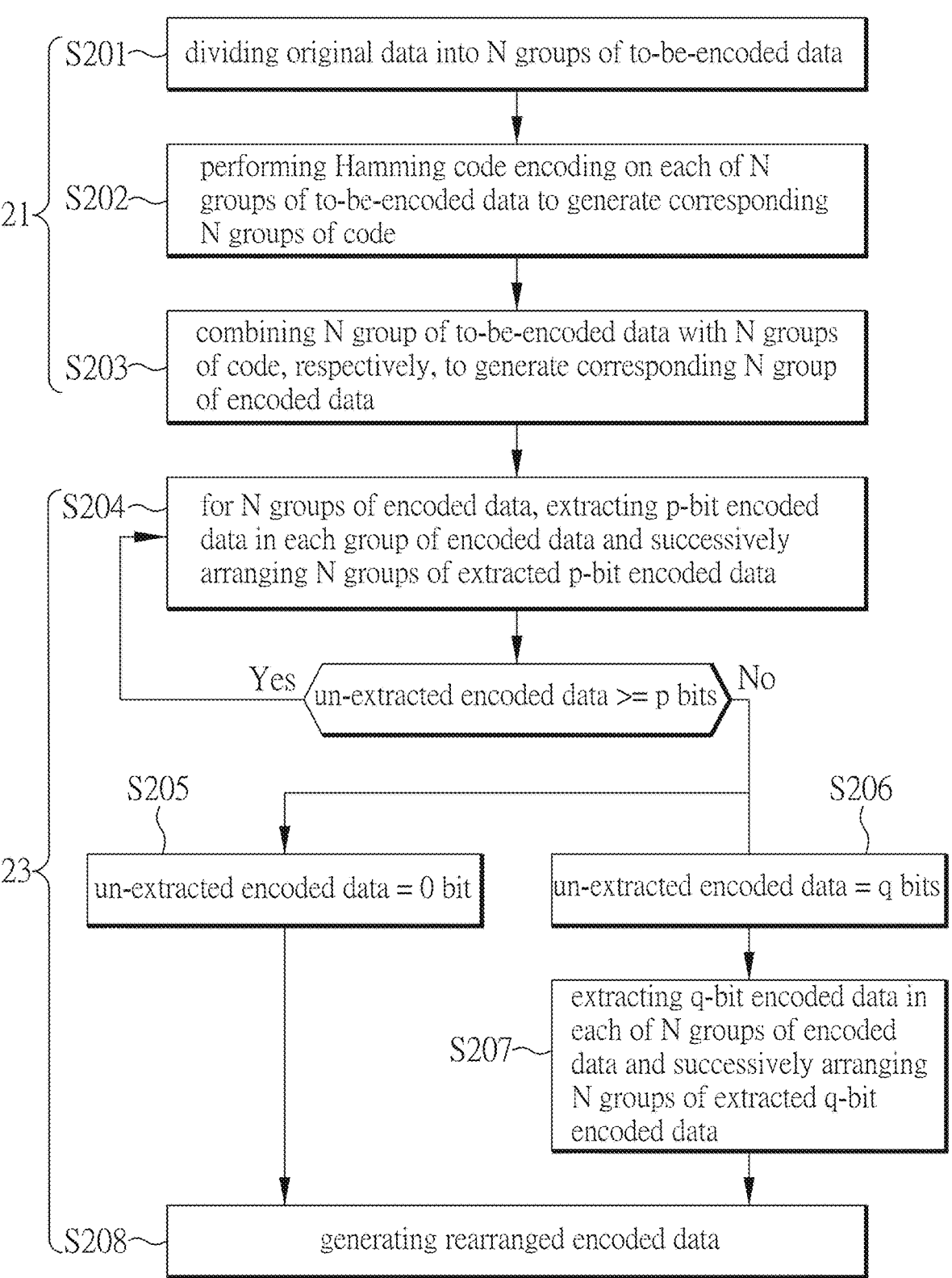
FIG. 2 shows the flowchart of the Hamming code encoding and arranging method of the present disclosure.

FIG. 2 shows the flowchart of the Hamming code encoding and arranging method of the present disclosure, which includes an encoding procedure 21 and an arranging procedure 23, wherein the encoding procedure 21 includes step S201 to step S203, and the arranging procedure 23 includes step S204 to step S208, both of which are described in details as follows.

In the encoding procedure 21, the original data 11 is first divided into N groups of to-be-encoded data A(1)~A(N) (step S201), wherein N is equal to Round(X/a), X represents the number of bits of the original data 11, a represents the number of bits of one group of to-be-encoded data, and Round( ) represents an integer function, where X, N and a are each an integer greater than 0. Then, the N groups of to-be-encoded data A(1)~A(N) are each performed with (c, a) Hamming code encoding to generate corresponding N groups of codes B(1)~B(N) (step S202), wherein the number of bits of one group of codes is b, b is the minimum value that satisfies $2^b >= a+b+1$, and b=c−a, where b and c are each an integer greater than 0. Then, the aforementioned N group of to-be-encoded data A(1)~A(N) are combined with N groups of codes B(1)~B(N), respectively, to generate corresponding N group of encoded data C(1)~C(N) (step S203), wherein the number of bits of one group of encoded data is c (which is equal to a+b).

In the arranging procedure 23, first, in step S204, for the N groups of encoded data C(1)~C(N), it extracts p-bit encoded data (i.e., p bits of encoded data) in each group of encoded data C(1)~C(N), and successively arranges the N groups of extracted p-bit encoded data, where p is an integer greater than 0 and p is smaller than or equal to c. It is noted that, in the arranging procedure 23, the aforementioned successive arrangement means that the extracted data are arranged successively according to the order of extracting, and also means that the data extracted this time is arranged following the previously extracted and arranged data. In one embodiment, the p-bit encoded data refers to continuous encoded data from low bit to high bit, while this is only an example but not a limitation. It is conceivable that the p-bit encoded data may refer to continuous encoded data from high bit to low bit, or may refer to discontinuous encoded data from low bit to high bit, or may refer to discontinuous encoded data from high bit to low bit.

Next, it determines the number of bits of the un-extracted encoded data remaining in each of the N groups of encoded data C(1)~C(N). When the number of bits of the un-extracted encoded data remaining in each of the N groups of encoded data C(1)~C(N) is greater than or equal to p, it continues to extract p-bit encoded data in each group of the encoded data C(1)~C(N), and successively arranges the N groups of extracted p-bit encoded data (step S204).

When there is no un-extracted encoded data remaining in each of the N groups of encoded data C(1)~C(N) (step S205), it generates the rearranged encoded data 13 according to the aforementioned arrangement (step S208). Alternatively, when there is only q-bit un-extracted encoded data (i.e., q bits of un-extracted encoded data) remaining in each of the N groups of encoded data C(1)~C(N) (step S206), where q is an integer greater than 0 and smaller than p, it extracts the q-bit encoded data in each of the N groups of encoded data C(1)~C(N), and successively arranges the N groups of extracted q-bit encoded data (step S207), so as to generate the rearranged encoded data (step S208).

Figure 3:
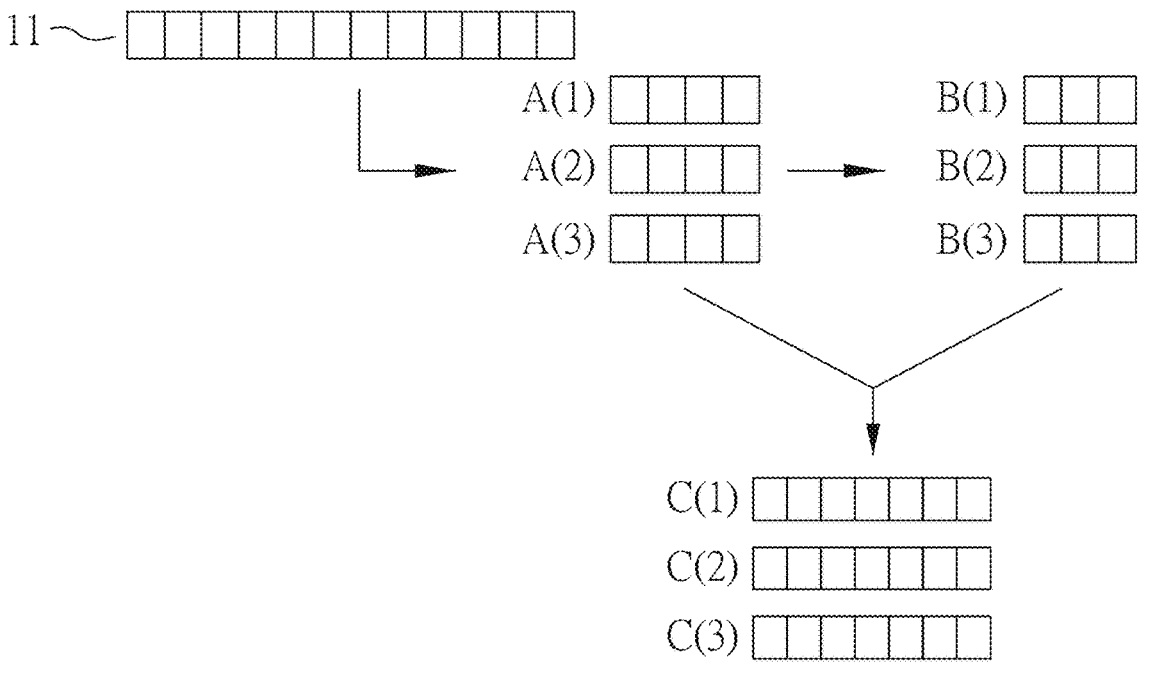
FIG. 3 schematically illustrates the encoding procedure of the Hamming code encoding and arranging method.

In order to further illustrate the Hamming code encoding and arranging method of the present disclosure, an illustration will be given by taking an example that performs the (7, 4) Hamming code encoding on the 12-bit original data 11. In the encoding procedure 21, as shown in FIG. 3 which schematically illustrates the encoding procedure of the Hamming code encoding and arranging method, the original data 11 is divided into three (which is equal to Round(12/4)) groups of to-be-encoded data A(1)~A(3), and the three groups of to-be-encoded data A(1)~A(3) are respectively performed with (7, 4) Hamming code encoding to generate corresponding three groups of codes B(1)~B(3), in which the number of bits of a group of codes is 3 (3 is the minimum value that satisfies 23>=4+3+1). The aforementioned three groups of to-be-encoded data A(1)~A(3) are combined with the three groups of codes B(1)~B(3), respectively, so as to generate the corresponding three groups encoded data C(1)~C(3), in which the number of bits of a group of encoded data is 7(=4+3).

Figure 4:
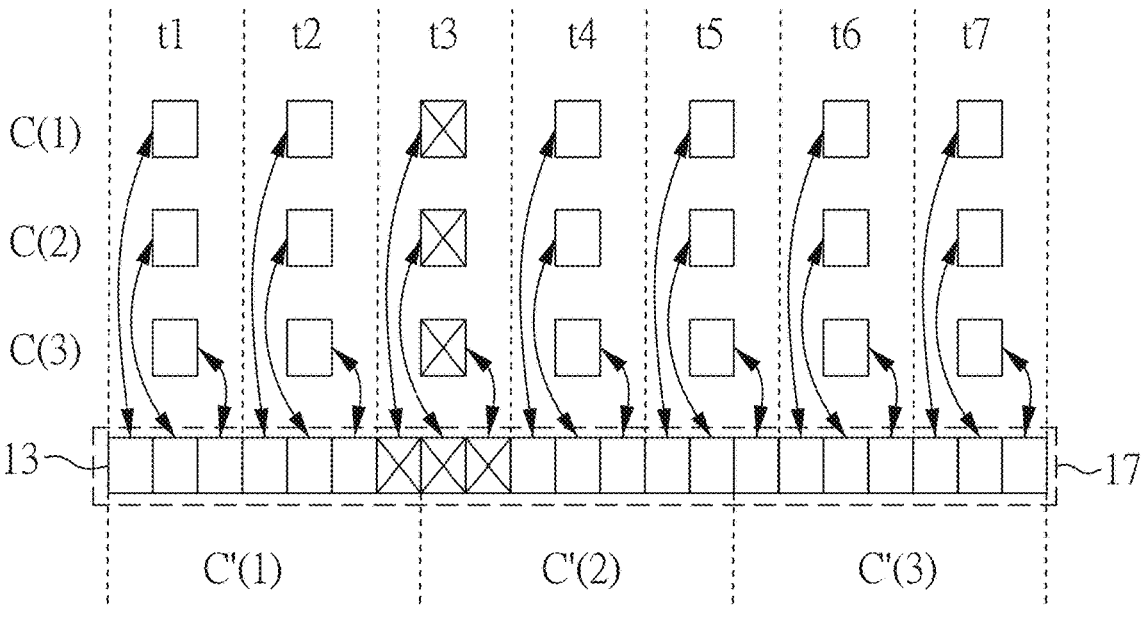
FIG. 4 schematically illustrates the first example of the arranging procedure of the Hamming code encoding and arranging method.

In the arranging procedure 23, it selects p=1 as the first example and defines this example as the type-1 Hamming code encoding arranging method. Because of p=1, for three groups of encoded data C(1)~C(3), the arranging procedure 23 extracts 1-bit encoded data (i.e., one bit of encoded data) in each of the three groups of encoded data C(1)~C(3), and successively arranges the three groups of extracted 1-bit encoded data. In this example, as shown in FIG. 4 which schematically illustrates the first example of the arranging procedure of the Hamming code encoding and arranging method, based on the arranging procedure 23, the aforementioned step of successively arranging the extracted three groups of 1-bit encoded data will be repeated 7 times (as denoted by t1~t7 in the figure), until there is no un-extracted encoded data remaining in each of the three groups of encoded data C(1)~C(3), thereby generating the rearranged encoded data 13. The (7, 4) Hamming code can be used to correct 1-bit error (i.e., one error bit) for each group of 7-bit encoded data C(1)~C(3) (wherein 1-bit error stands for one error bit in one group of encoded data). Therefore, for the case of having continuous three error bits (for example, the bits marked as "X" in FIG. 4) caused by storing the rearranged encoded data 13 into the storage device 17, this case of having continuous three error bits in the storage device 17 cannot be corrected (for example, as shown in FIG. 4, the rearranged encoded data C'(2) has 2-bit errors (i.e., two error bits) that cannot be corrected). However, these 3 error bits are originated from three groups of encoded data C(1)~C(3), respectively, and thus, when reading the rearranged encoded data 13 from the storage device 17, each group of encoded data C(1)~C(3) only has 1-bit error, which still can be corrected.

Figure 5:
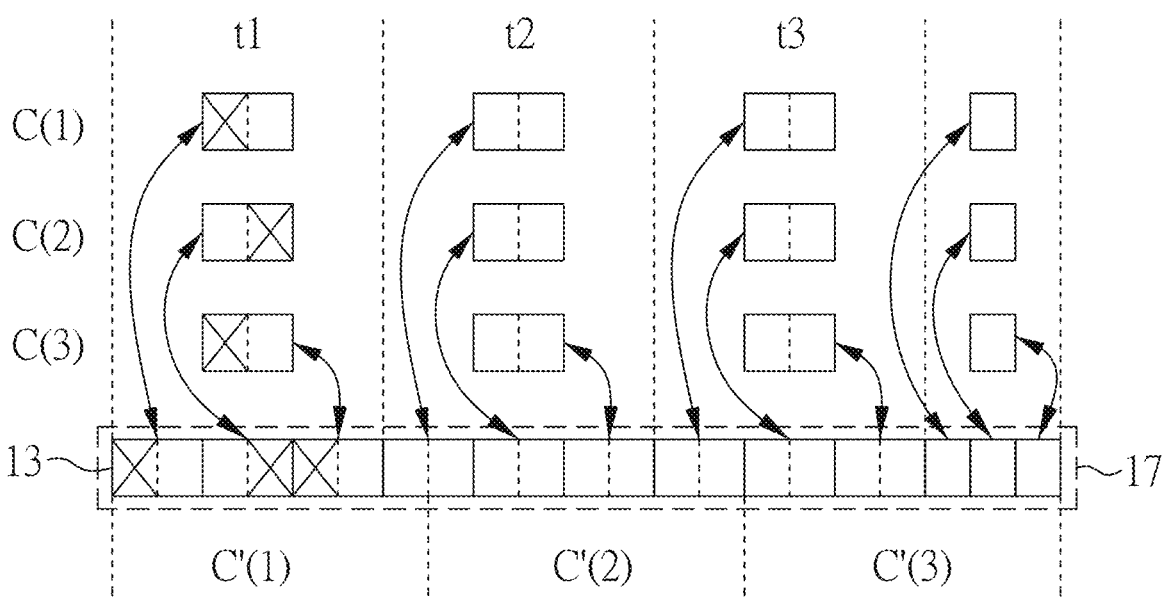
FIG. 5 schematically illustrates the second example of the arranging procedure of the Hamming code encoding and arranging method.

In the arranging procedure 23, it selects p=2 as the second example and defines this example as the type-2 Hamming code encoding arranging method. Because of p=2, for three groups of encoded data C(1)~C(3), the arranging procedure 23 extracts 2-bit encoded data (i.e., two bits of encoded data) in each of the three groups of encoded data C(1)~C(3), and successively arranges the three groups of extracted 2-bit encoded data. In this example, as shown in FIG. 5 which schematically illustrates the second example of the arranging procedure of the Hamming code encoding and arranging method, based on the arranging procedure 23, the aforementioned step of successively arranging the three groups of extracted 2-bit encoded data will be repeated three times (as denoted by t1~t3 in the figure), until there is only 1-bit un-extracted encoded data (i.e., one bit of un-extracted encoded data) remaining in each of the three groups of encoded data C(1)~C(3). Then, it extracts the 1-bit encoded data in each of the three groups of encoded data C(1)~C(3) and successively arranges the three groups of extracted 1-bit encoded data, thereby generating the rearranged encoded data 13. The (7, 4) Hamming code can be used to correct 1-bit error for each of the three groups of 7-bit encoded data C(1)~C(3). Therefore, for the case of having error bits spaced apart by one or two bits or having continuous two error bits (for example, the bits marked as "X" in FIG. 5) caused by storing the rearranged encoded data 13 into the storage device 17, this case of having error bits spaced apart by one or two bits or having continuous two error bits may not be corrected due to bad storage bits in the storage device 17 (for example, as shown in FIG. 5, the rearranged encoded data C'(1) has 3-bit errors (i.e., three error bits) that cannot be corrected). However, these error bits are originated from three groups of encoded data C(1)~C(3), respectively, and thus, when reading the rearranged encoded data 13 from the storage device 17 for resuming to the original arrangement, each of the three groups of encoded data C(1)~C(3) only has 1-bit error, which still can be corrected.

Figure 6:
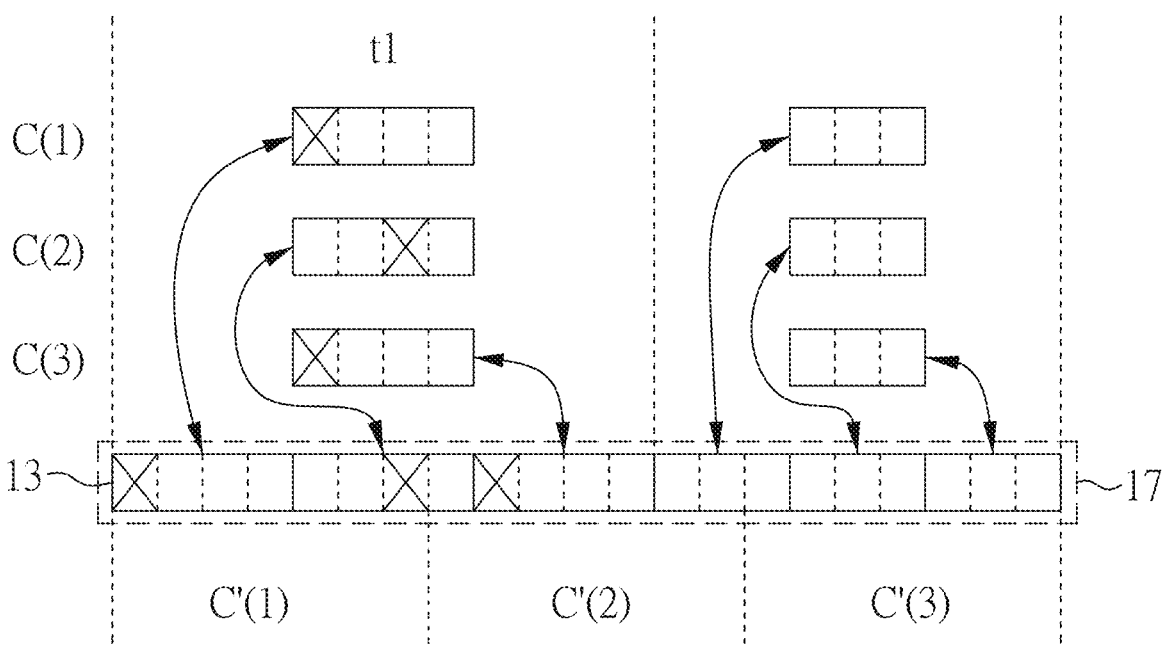
FIG. 6 schematically illustrates the third example of the arranging procedure of the Hamming code encoding and arranging method.

In the arranging procedure 23, it selects p=4 as the third example and defines this example as the type-3 Hamming code encoding and arranging method. Because of p=4, for three groups of encoded data C(1)~C(3), the arranging procedure 23 extracts 4-bit encoded data (i.e., four bits of encoded data) in each of three groups of encoded data C(1)~C(3), and successively arranges the three groups of extracted 4-bit encoded data. In this example, as shown in FIG. 6 which schematically illustrates the third example of the arranging procedure of the Hamming code encoding and arranging method, based on the arranging procedure 23, the aforementioned step of successively arranging the three groups of extracted 4-bit encoded data will be repeated 1 time (as denoted by t1 in the figure), until there is only 3-bits un-extracted encoded data (i.e., three bits of un-extracted encoded data) remaining in each of the three groups of encoded data C(1)~C(3). Then, it extracts the 3-bit encoded data (i.e., three bits of encoded data) in each of the three groups of encoded data C(1)~C(3) and successively arranges the three groups of extracted 3-bit encoded data, thereby generating the rearranged encoded data 13. The (7, 4) Hamming code can be used to correct 1-bit error for each of the three groups of 7-bit encoded data C(1)~C(3). Therefore, for the case of having error bits spaced apart by one to seven bits (for example, the bits marked as "X" in FIG. 6) caused by storing the rearranged encoded data 13 into the storage device 17, this case of having error bits spaced apart by one to seven bits may not be corrected due to bad storage bits in the storage device 17 (for example, the rearranged encoded data C'(1) has 2-bit errors that cannot be corrected). However, these bits are originated from three groups of encoded data C(1)~C(3), respectively, and thus, when reading the rearranged encoded data 13 from the storage device 17 for resuming to the original arrangement, each of the three groups of encoded data C(1)~C(3) only has 1-bit error, which still can be corrected.

Figure 7:
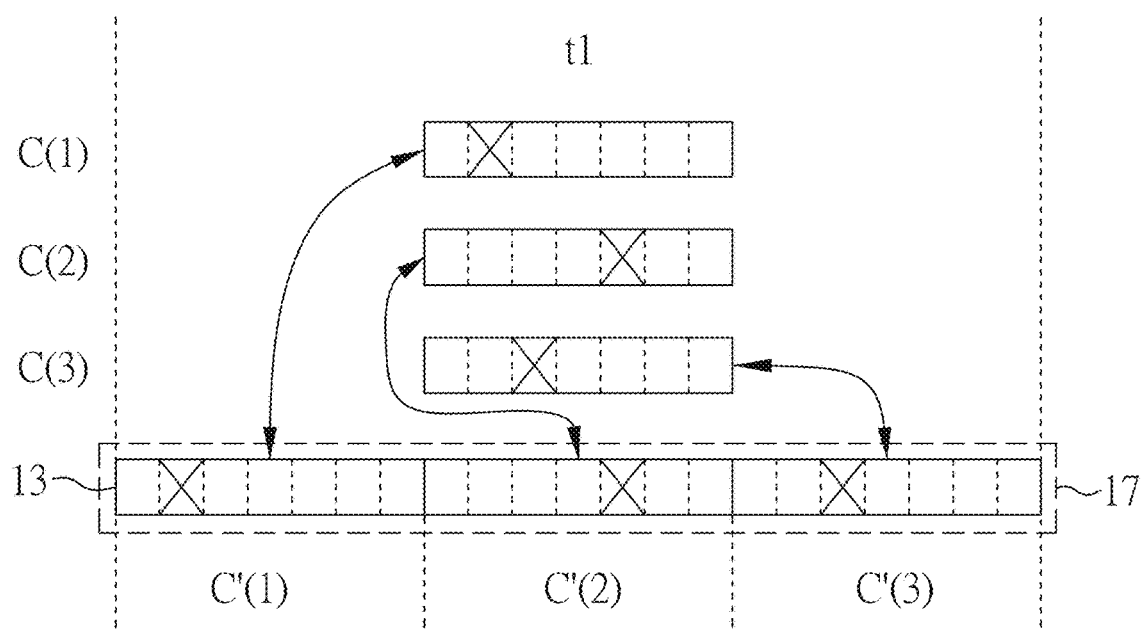
FIG. 7 schematically illustrates the fourth example of the arranging procedure of the Hamming code encoding and arranging method.

In the arranging procedure 23, it selects p=7 as the fourth example and defines this example as the type-4 Hamming code encoding and arranging method. Because of p=7, for three groups of encoded data C(1)~C(3), the arranging procedure 23 extracts 7-bit encoded data (i.e., seven bits of encoded data) in each of the three groups of encoded data C(1)~C(3), and successively arranges the three groups of extracted 7-bit encoded data. In this example, as shown in FIG. 7 which schematically illustrates the fourth example of the arranging procedure of the Hamming code encoding and arranging method, based on the arranging procedure 23, the aforementioned step of successively arranging the three groups of extracted 7-bit encoded data will be repeated 1 time (as denoted by t1 in the figure) and then there is no un-extracted encoded data remaining in each of the three groups of encoded data C(1)~C(3), thereby generating the rearranged encoded data 13. The (7, 4) Hamming code can be used to correct 1-bit error for each of the three groups of 7-bit encoded data C(1)~C(3). Therefore, this example is suitable for correcting 1-bit error in one group of 7-bit encoded data. By taking the rearranged encoded data 13 stored in the storage device 17 as an example, in the case that each group of rearranged encoded data C'(1)~C'(3) has 1-bit error caused by bad storage bits in the storage device 17, when the rearranged encoded data 13 obtained from the arranging procedure 23 of the present disclosure is read from the storage device 17 for resuming to the original arrangement, the error can be corrected as each of three groups of encoded data C(1)~C(3) only has 1-bit error.

Figure 8:
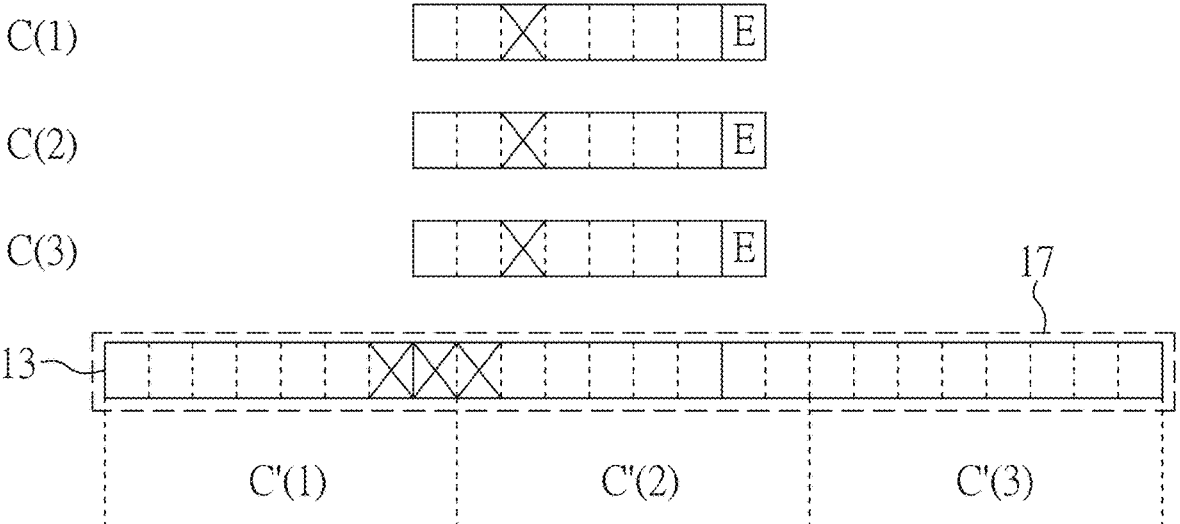
FIG. 8 schematically illustrates the arranging procedure of the Hamming code encoding and arranging method with parity bits.

Furthermore, in the encoding procedure 21, for the generated N groups of encoded data C(1)~C(N), a parity bit may be added to each of the N groups of encoded data C(1)~C(N) so as to provide 2-bit error detection capability. For example, in this embodiment, as shown in FIG. 8 which schematically illustrates the arranging procedure of the Hamming code encoding and arranging method with parity bits, the type-1 Hamming code encoding and arranging method of FIG. 4 is used to generate the rearranged encoded data. Because the parity bit (E) is added, as shown in FIG. 8, each of the three groups of encoded data C(1)~C(3) has 8(=7+1) bits, and each group of encoded data can detect 2-bit error, so that one group of 8-bit encoded data in the rearranged encoded data 13 generated by using p=1 to perform arranging can also detect 2-bit error.

Figure 9:
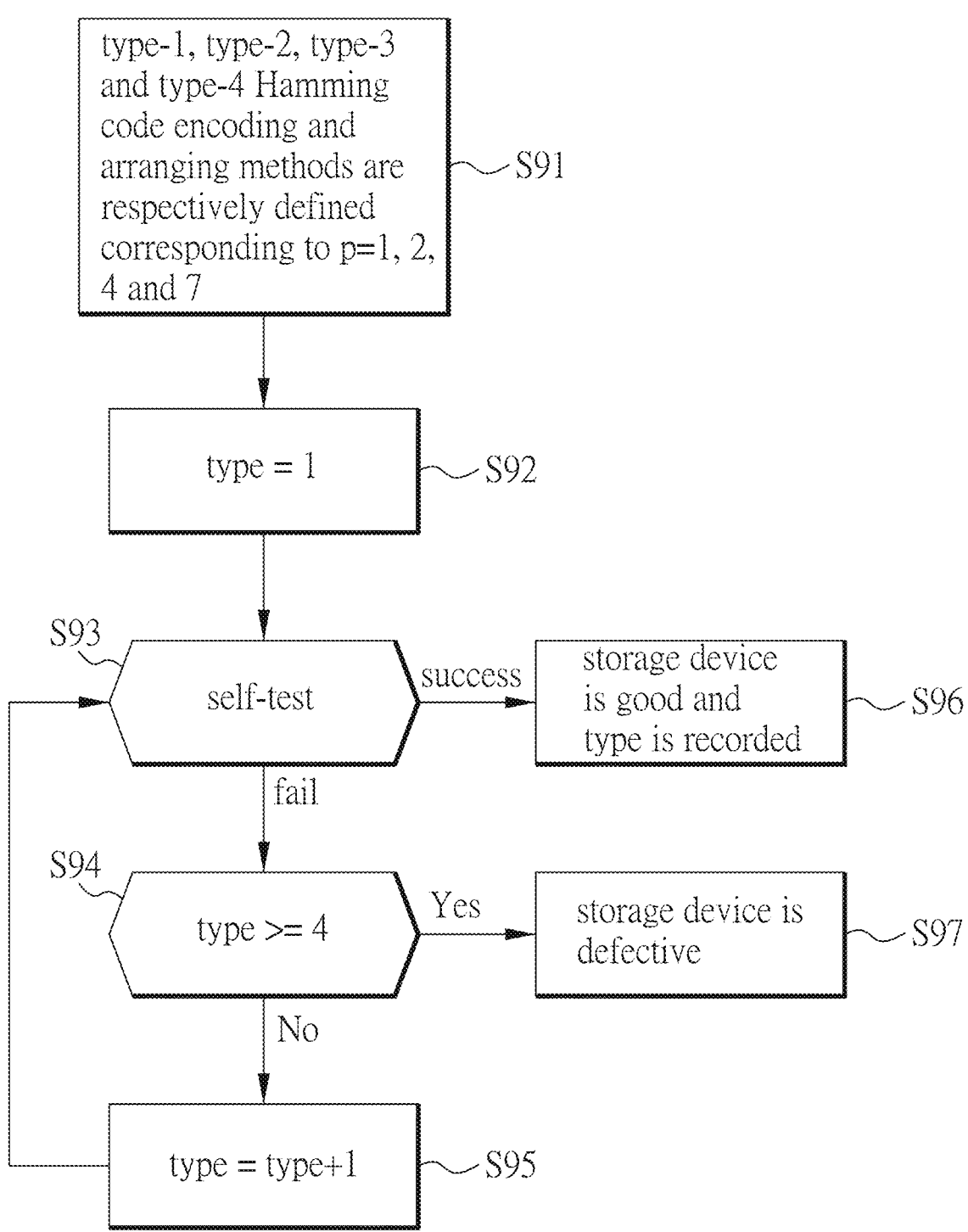
FIG. 9 schematically illustrates the application of Hamming code encoding and arranging method of the present disclosure to a storage device detection method.

In addition, the Hamming code encoding and arranging method of the present disclosure may also be used to improve the yield of the storage device 17, and please refer to FIG. 9 which schematically illustrates the application of Hamming code encoding and arranging method of the present disclosure to a storage device detection method. First, according to the range of p in step S204 (an integer greater than 0 and smaller than or equal to c), multiple different values of p are selected to define multiple types of Hamming code encoding and arranging methods (step S91), wherein the aforementioned multiple types of Hamming code encoding and arranging method correspond to the aforementioned different values of p, respectively. By taking the aforementioned (7, 4) Hamming code as an example, in step S91, it may define type-1 to type-4 Hamming code encoding and arranging methods corresponding to p=1, 2, 4 and 7, respectively. When producing and testing the storage device 17, multiple types of Hamming code encoding and arranging methods (for example, type-1 to type-4 in FIG. 4 to FIG. 7) can be used in sequence to perform a self-test on the storage device 17 (step S92 to step S95). When the detection of the self-test performed by a type of Hamming code encoding and arranging method is successful (for example, the read/write data is correct or there are errors but can be corrected), this type of Hamming code encoding and arranging method can be recorded in the storage device 17 so as to successfully complete and end the self-test of the storage device 17 (step S96). If the self-test for all types of Hamming code encoding and arranging methods (type-1 to type-4) fails (for example, the read/write data has errors and cannot be corrected), it is determined that the storage device 17 is a defective product (step S97).

From the above description, it can be seen that, with the Hamming code encoding and arranging method of the present disclosure, multi-bit error correction or detection may be realized at the optimal bit rate by dynamically adjusting the arrangement of multiple groups of Hamming code for predictable error patterns. When being applied to storage devices (such as SRAM with large capacity and high error rate), because bit error locations are usually regular and predictable, such as errors of two adjacent bits, errors spaced apart by two bits, or other easily predictable multi-bit error locations. Therefore, in response to these regular or predictable error patterns, by combining two or more groups of Hamming code and dynamically configuring the encoded permutation and combination, the present disclosure is able to achieve error correction or detection of multiple bits at specific positions, and maintain the original simple structure and easy implementation of traditional Hamming code, thereby improving the reliability of data transmission or storage and increasing the yield of the storage devices.

The aforementioned specific embodiments should be construed as merely illustrative, and not limiting the rest of the present disclosure in any way.

The invention claimed is:

1. A Hamming code encoding and arranging method for a storage device, comprising the steps of:

(A) dividing an original data into N groups of to-be-encoded data and performing (c, a) Hamming code encoding on the N groups of to-be-encoded data, respectively, to generate corresponding N groups of codes thereby producing corresponding N groups of encoded data, wherein N is equal to Round(X/a), X represents a number of bits of the original data, a represents a number of bits of one group of to-be-encoded data, Round( ) represents an integer function, c represents a number of bits of one group of encoded data and c is equal to a+b, b represents a number of bits of one group of codes and is a minimum value satisfying 2b>=a+b+1, where X, N, a, b, c are each an integer greater than 0;

(B) for the N groups of encoded data, extracting p-bit encoded data in each group of encoded data, and successively arranging N groups of extracted p-bit encoded data, where p is an integer greater than 0 and p is smaller than c;

(C) when a number of bits of un-extracted encoded data remaining in each of the N groups of encoded data is greater than or equal to p, extracting p-bit encoded data in each group of the encoded data, and successively arranging N groups of extracted p-bit encoded data;

(D) when there is no un-extracted encoded data remaining in each of the N groups of encoded data, generating rearranged encoded data according to arrangement in step (B) and step (C); or when there is only q-bit un-extracted encoded data remaining in each of the N groups of encoded data, extracting q-bit encoded data in each of the N groups of encoded data, and successively arranging N groups of extracted q-bit encoded data so as to generate the rearranged encoded data, where q is an integer greater than 0 and smaller than p;

(E) writing the rearranged encoded data into the storage device; and (F) reading the rearranged encoded data from the storage device.

2. The Hamming code encoding and arranging method as claimed in claim 1, wherein, in step (A), the N groups of encoded data are generated by combining the N groups of to-be-encoded data with the corresponding N groups of codes, respectively.

3. The Hamming code encoding and arranging method as claimed in claimed 1, wherein the p-bit encoded data is continuous encoded data from low bit to high bit.

4. The Hamming code encoding and arranging method as claimed in claim 1, wherein, in step (A), a parity bit is added to each group of encoded data.

5. The Hamming code encoding and arranging method as claimed in claim 1, wherein the rearranged encoded data is stored in a storage device.

6. The Hamming code encoding and arranging method as claimed in claim 1, wherein the (c, a) Hamming code is a (7, 4) Hamming code.

7. The Hamming code encoding and arranging method as claimed in claim 6, wherein p is equal to 1.

8. The Hamming code encoding and arranging method as claimed in claimed 6, wherein p is equal to 2.

9. The Hamming code encoding and arranging method as claimed in claim 6, wherein p is equal to 4.

10. A storage device detection method for detecting a storage device using a Hamming code encoding and arranging method including the steps of: dividing an original data into N groups of to-be-encoded data and performing (c, a) Hamming code encoding on the N groups of to-be-encoded data, respectively, to generate corresponding N groups of codes thereby producing corresponding N groups of encoded data, wherein N is equal to Round(X/a), X represents a number of bits of the original data, a represents a number of bits of one group of to-be-encoded data, Round( ) represents an integer function, c represents a number of bits of one group of encoded data and c is equal to a+b, b represents a number of bits of one group of codes and is a minimum value satisfying 2b>=a+b+1, where X, N, a, b, c are each an integer greater than 0 and p is smaller than or equal to c; for the N groups of encoded data, extracting p-bit encoded data in each group of encoded data, and successively arranging N groups of extracted p-bit encoded data, where p is an integer greater than 0 and p is smaller than c; when a number of bits of un-extracted encoded data remaining in each of the N groups of encoded data is greater than or equal to p, extracting p-bit encoded data in each group of the encoded data, and successively arranging N groups of extracted p-bit encoded data; and when there is no un-extracted encoded data remaining in each of the N groups of encoded data, generating rearranged encoded data accordingly; or when there is only q-bit un-extracted encoded data remaining in each of the N groups of encoded data, extracting q-bit encoded data in each of the N groups of encoded data, and successively arranging N groups of extracted q-bit encoded data so as to generate the rearranged encoded data, where q is an integer greater than 0 and smaller than p; the storage device detection method comprising:

selecting multiple different values of p from a range of integer greater than 0 and smaller than or equal to c to define multiple types of Hamming code encoding and arranging methods according to the multiple different values of p, wherein the multiple types of Hamming code encoding and arranging methods correspond to the multiple different values of p, respectively;

using the multiple types of Hamming code encoding and arranging methods in sequence to perform a self-test on the storage device by writing the rearranged encoded data into the storage device and then reading the rearranged encoded data from the storage device, wherein, when the self-test for a type of Hamming code encoding and arranging method is successful in which the rearranged encoded data read from the storage device is correct or has correctable error, the Hamming code encoding and arranging method of the type is recorded in the storage device and the self-test is ended and, when the self-test for all types of Hamming code encoding and arranging methods fails in which the rearranged encoded data read from the storage device has uncorrectable error, the storage device is determined to be defective.

11. The storage device detection method as claimed in claim 10, wherein, when the (c, a) Hamming code is a (7, 4) Hamming code, the multiple different values of p include 1, 2, 4 and 7.

* * * * *